(12) United States Patent
Ota et al.

(10) Patent No.: US 12,303,973 B2
(45) Date of Patent: May 20, 2025

(54) PRODUCTION METHOD FOR ALUMINUM-DIAMOND COMPOSITE

(71) Applicant: DENKA COMPANY LIMITED, Tokyo (JP)

(72) Inventors: Hiroaki Ota, Tokyo (JP); Yosuke Ishihara, Tokyo (JP); Daisuke Goto, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 18/562,539

(22) PCT Filed: May 16, 2022

(86) PCT No.: PCT/JP2022/020392
§ 371 (c)(1),
(2) Date: Nov. 20, 2023

(87) PCT Pub. No.: WO2022/249918
PCT Pub. Date: Dec. 1, 2022

(65) Prior Publication Data
US 2024/0226997 A1    Jul. 11, 2024

(30) Foreign Application Priority Data

May 26, 2021   (JP) ................................ 2021-088543

(51) Int. Cl.
*B22D 19/14*     (2006.01)
*B22D 18/02*     (2006.01)
(Continued)

(52) U.S. Cl.
CPC ............. *B22D 19/14* (2013.01); *B22D 18/02* (2013.01); *C22C 1/1073* (2023.01); *C22C 26/00* (2013.01);
(Continued)

(58) Field of Classification Search
CPC .......... B22D 18/02; B22D 19/14; C22C 1/10; C22C 1/1073; C22C 26/00
(Continued)

(56) References Cited

U.S. PATENT DOCUMENTS

| | | |
|---|---|---|
| 2011/0316040 A1 | 12/2011 | Hirotsuru et al. |
| 2018/0281230 A1 | 10/2018 | Ota et al. |
| 2019/0093201 A1 | 3/2019 | Ishihara et al. |

FOREIGN PATENT DOCUMENTS

| | | |
|---|---|---|
| JP | 2012-158817 A | 8/2012 |
| WO | 2010/092972 A1 | 8/2010 |

(Continued)

OTHER PUBLICATIONS

Nov. 21, 2023 International Preliminary Report on Patentability issued in International Patent Application No. PCT/JP2022/020392.
(Continued)

*Primary Examiner* — Kevin P Kerns
(74) *Attorney, Agent, or Firm* — Oliff PLC

(57) ABSTRACT

A production method for an aluminum-diamond composite having a step of providing a laminate structure including a composition layer containing a diamond powder in an opening of a flat plate-like porous material having the opening so as to be separated from an inner circumferential surface of the opening and a step of press-fitting a melt of a metal containing aluminum into a space between the porous material and the laminate structure and impregnating the composition layer with the melt to form a composited part containing aluminum and diamond and forming metal layers on at least side surfaces of the laminate structure, in which the laminate structure includes a first mold release plate, a first inorganic layer, the composition layer, a second inorganic layer and a second mold release plate in this order.

13 Claims, 5 Drawing Sheets

(51) Int. Cl.
    *C22C 1/10*          (2023.01)
    *C22C 26/00*        (2006.01)
    *H01L 21/48*        (2006.01)
    *H01L 23/373*      (2006.01)

(52) U.S. Cl.
    CPC ...... *H01L 21/4871* (2013.01); *H01L 23/3733* (2013.01)

(58) Field of Classification Search
    USPC .................................. 164/75, 91, 97, 98, 100
    See application file for complete search history.

(56) References Cited

FOREIGN PATENT DOCUMENTS

| | | |
|---|---|---|
| WO | 2017/065139 A1 | 4/2017 |
| WO | 2017/158993 A1 | 9/2017 |

OTHER PUBLICATIONS

Jun. 14, 2022 International Search Report issued in International Patent Application No. PCT/JP2022/020392.

(a)

(b)

(c)

PRODUCTION METHOD FOR ALUMINUM-DIAMOND COMPOSITE

TECHNICAL FIELD

The present disclosure relates to a production method for an aluminum-diamond composite.

BACKGROUND ART

Aluminum-diamond composites are materials in which diamond having a high thermal conductivity and aluminum having a high thermal expansion rate are composited and are in use in a variety of applications such as heat sinks. In the production of an aluminum-diamond composite, a large composite is prepared and then processed into a product shape. However, the composite contains diamond and has a high hardness, and thus inexpensive mechanical processing is difficult. Therefore, in the production of aluminum-diamond composites, methods such as laser processing, water jet processing and discharge processing are being used.

In a case where an aluminum-diamond composite is used as a heat dissipation member, for example, the heat dissipation member is joined to another member such as a semiconductor element by metal plating and a brazing filler metal. However, the aluminum-diamond composite has a surface cut by laser processing as described above. A diamond powder exposed on the cut surface causes deterioration of the adhesion of metal plating or deterioration of the joining properties to the brazing filler metal and, furthermore, causes an increase in thermal resistance in the contact interface with another member in some cases.

Patent Literature 1 discloses a method in which a metal layer is further provided on a cut surface in order to reduce the influence of laser processing or the like on the cut surface. Specifically, a production method for an aluminum-diamond composite having a surface fully coated with a surface layer, the method including a step 1 of preparing a diamond powder, a step 2 of preparing one or more materials containing aluminum selected from a ceramic material containing aluminum and a metal material containing aluminum, a step 3 of fabricating a precursor of a flat plate-like aluminum-diamond composite having surface layers containing 80 vol % or more of a metal containing aluminum on both upper and lower surfaces by filling cavities in a mold material made of a porous body with the diamond powder in a state where a layer of the diamond powder having a material containing aluminum disposed on both upper and lower surfaces is further sandwiched with mold release plates from above and below and impregnating the mold material with a metal containing aluminum by a cast forging process and a step 4 of fabricating a flat plate-like aluminum-diamond composite having surface layers containing 80 vol % or more of a metal containing aluminum on all side surfaces by filling cavities in a mold material made of a porous body with the precursor in a state where a material containing aluminum is disposed on all side surfaces of the precursor and mold release plates are disposed on both upper and lower surfaces of the precursor and impregnating the mold material with a metal containing aluminum by a cast forging process is described.

CITATION LIST

Patent Literature

[Patent Literature 1] International Publication WO 2017/158993

SUMMARY OF INVENTION

Technical Problem

In association with the growing demand for aluminum-diamond composites, there is a desire for the production of the above-described composite within a shorter time to suppress the processing cost and improve the productivity, and there is a desire for directly and more simply producing an aluminum-diamond composite having a product shape without a laser processing treatment or the like having to be performed.

An objective of the present disclosure is to provide a method for producing an aluminum-diamond composite more simply than ever without laser processing or the like having to be performed.

Solution to Problem

The present disclosure provides the following [1] to [13].

[1] A production method for an aluminum-diamond composite including,
  a step of providing a laminate structure including a composition layer containing a diamond powder in an opening of a flat plate-like porous material having the opening so as to be separated from an inner circumferential surface of the opening, and
  a step of press-fitting a melt of a metal containing aluminum into a space between the porous material and the laminate structure and impregnating the composition layer with the melt to form a composited part containing aluminum and diamond and forming metal layers on at least side surfaces of the laminate structure,
  in which the laminate structure includes a first mold release plate, a first inorganic layer, the composition layer, a second inorganic layer and a second mold release plate in this order.

[2] The production method according to [1], in which the opening is a through hole that penetrates in a vertical direction.

[3] The production method according to [1], in which the opening is a recessed part.

[4] The production method according to any one of [1] to [3], in which the first inorganic layer is at least one of an inorganic fiber-containing layer and a metal foil containing aluminum.

[5] The production method according to any one of [1] to [4], in which the second inorganic layer is at least one of an inorganic fiber-containing layer and a metal foil containing aluminum.

[6] The production method according to any one of [1] to [5], in which a distance between the inner circumferential surface of the opening of the porous material and the laminate structure is 0.05 to 3.50 mm.

[7] The production method according to any one of [1] to [6], further having a step of adjusting an average thickness of the metal layers.

[8] The production method according to any one of [1] to [7], in which the step of forming the metal layers is performed by a cast forging process.

[9] The production method according to any one of [1] to [8], in which a content of aluminum in the melt is 80 mass % or more.

[10] The production method according to any one of [1] to [9], in which the aluminum-diamond composite has a flat plate-like composited part containing aluminum and diamond, metal-containing layers provided on a pair of main surfaces of the composited part and metal layers provided on side surfaces of the composited part, and an average thickness of the metal layers is 0.01 to 3.00 mm.

[11] The production method according to [10], in which surfaces of the metal-containing layers and the metal layers opposite to the composited part are smooth surfaces.

[12] The production method according to [11], in which surface roughness Ra in the smooth surfaces is 0.5 to 1.0 μm.

[13] The production method according to any one of to [12], in which an average thickness of the metal-containing layers is 0.01 to 0.20 mm.

One aspect of the present disclosure provides a production method for an aluminum-diamond composite having a step of providing a laminate structure including a composition layer containing a diamond powder in an opening of a flat plate-like porous material having the opening so as to be separated from an inner circumferential surface of the opening and a step of press-fitting a melt of a metal containing aluminum into a space between the porous material and the laminate structure and impregnating the composition layer with the melt to form a composited part containing aluminum and diamond and forming metal layers on at least side surfaces of the laminate structure, in which the laminate structure includes a first mold release plate, a first inorganic layer, the composition layer, a second inorganic layer and a second mold release plate in this order.

In the production method for an aluminum-diamond composite, the laminate structure is provided over the inner circumferential surface (for example, the entire circumference of the inner wall in a case where the opening is a through hole) of the opening of the porous material with a gap therebetween, which makes the melt of the metal containing aluminum that is to be press-fitted afterwards spread on the surface of the laminate structure and thereby makes it possible to directly produce an aluminum-diamond composite having the metal layers containing aluminum on the surfaces. Therefore, there is no need of laser processing, and the number of steps for processing is also small, which makes it possible to produce an aluminum-diamond composite within a shorter time than ever.

In the above-described production method, the metal layers are formed between a formwork and the composited part at the time of forming the composited part containing aluminum and diamond, whereby an aluminum-diamond composite having a product shape is directly produced.

The opening may be a through hole that penetrates in the vertical direction. When the opening is a through hole, it becomes easier to remove the composite from the formwork after the metal layers are formed.

The opening may be a recessed part.

The first inorganic layer may be at least one of an inorganic fiber-containing layer and a metal foil containing aluminum.

The second inorganic layer may be at least one of an inorganic fiber-containing layer and a metal foil containing aluminum.

The distance between the inner circumferential surface of the opening of the porous material and the laminate structure may be 0.05 to 3.50 mm.

The production method may further have a step of adjusting the average thickness of the metal layers.

The step of forming the metal layers may be performed by a cast forging process.

The content of aluminum in the melt may be 80 mass % or more.

The aluminum-diamond composite that is obtained by the above-described production method has a flat plate-like composited part containing aluminum and diamond, metal-containing layers provided on a pair of main surfaces of the composited part and metal layers provided on side surfaces of the composited part, and the average thickness of the metal layers may be 0.01 to 3.00 mm. When the average thickness of the metal layers is within a predetermined range, an aluminum-diamond composite to be obtained is capable of exhibiting excellent thermal shock resistance in the joint surfaces between the composited part and the metal layers.

The surfaces of the metal-containing layers and the metal layers opposite to the composited part may be smooth surfaces.

The surface roughness Ra in the smooth surfaces may be 0.5 to 1.0 μm.

The average thickness of the metal-containing layers may be 0.01 to 0.20 mm.

Advantageous Effects of Invention

According to the present disclosure, it is possible to provide a method for producing an aluminum-diamond composite more simply than ever without laser processing or the like having to be performed.

DESCRIPTION OF EMBODIMENTS

Hereinafter, embodiments of the present disclosure will be described with reference to drawings depending on the situations. However, the following embodiments are examples for describing the present disclosure and do not intend to limit the present disclosure to the following contents.

Materials to be exemplified in the present specification can be used singly or two or more thereof can be combined together and used unless particularly otherwise described. In a case where a plurality of substances are present as a certain component in a composition, unless particularly otherwise described, the content of the component in the composition means the total amount of the plurality of substances present in the composition. In the present specification, unless particularly otherwise described, ranges expressed using "to" include the lower limit value and the upper limit value, and, for example, "X to Y" means "X or more and Y or less."

One embodiment of a production method for an aluminum-diamond composite has a step of providing a laminate structure including a composition layer containing a diamond powder in the opening of a flat plate-like porous material having the opening so as to be separated from the inner circumferential surface of the opening (hereinafter, also referred to as the laminate structure-laying step), a step of press-fitting a melt of a metal containing aluminum into a space between the porous material and the laminate structure and impregnating the composition layer with the melt to form a composited part containing aluminum and diamond and forming metal layers on at least the side surfaces of the laminate structure (hereinafter, also referred to as the metal layer-forming step), and a step of adjusting the average thickness of the metal layers (hereinafter, also referred to as the layer thickness-adjusting step). The layer thickness-adjusting step is an arbitrary step and can be skipped. The layer thickness-adjusting step may be skipped if the average thickness of the metal layers that are formed by the metal layer-forming step is 0.01 to 3.00 mm.

Figure 1:
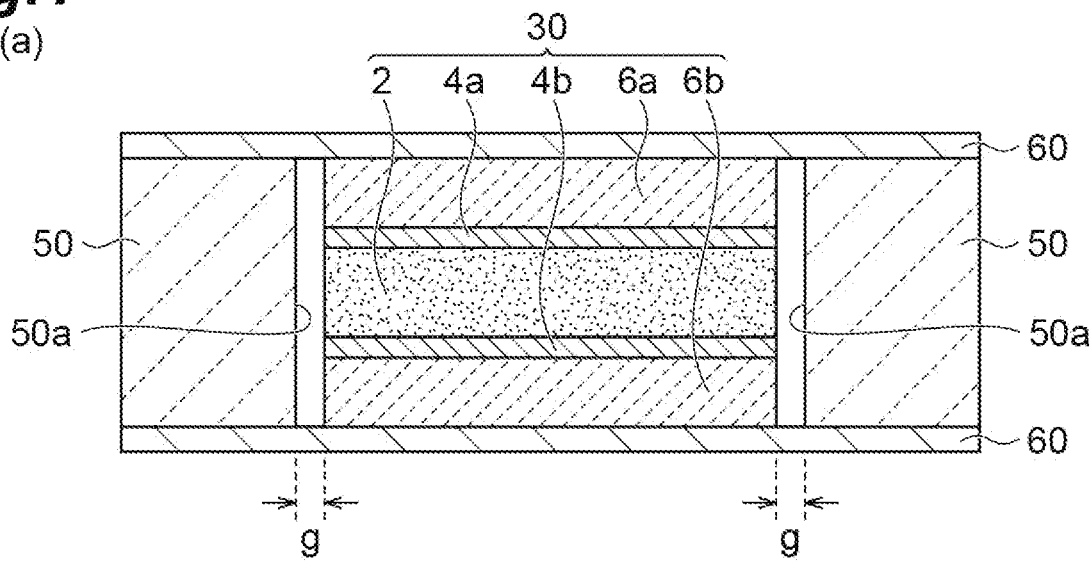
FIG. 1 is a schematic view for describing an example of a production method for an aluminum-diamond composite.
Figure 1:
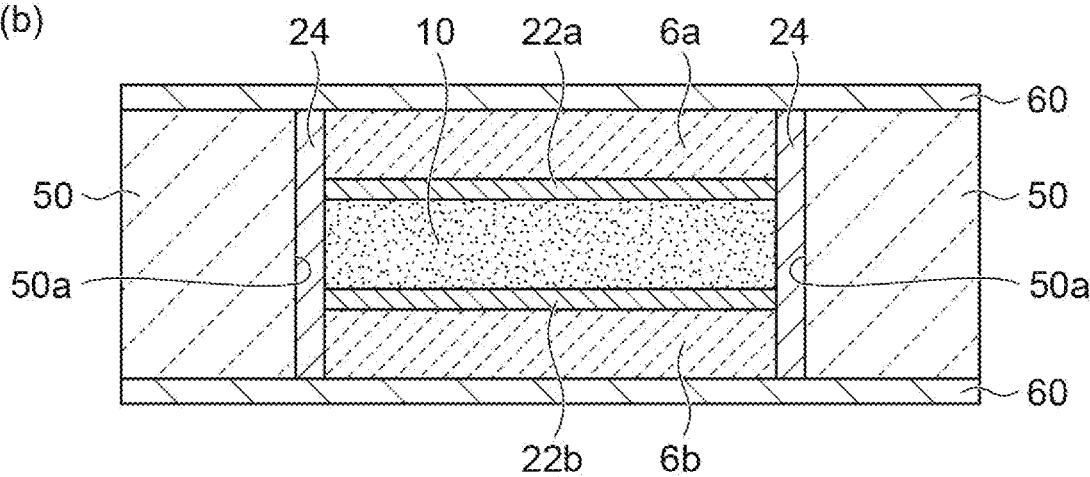
Figure 1:
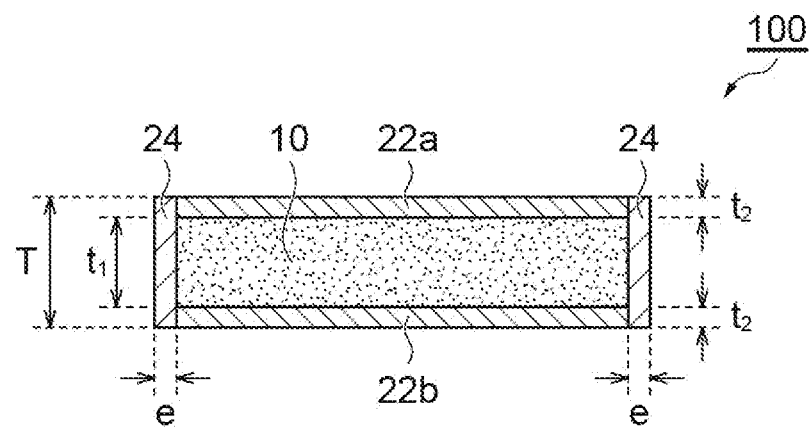

FIG. 1 is a schematic view for describing an example of the production method for an aluminum-diamond composite. FIG. 1(a) shows the laminate structure-laying step, FIG. 1(b) shows the metal layer-forming step, and FIG. 1(c) is a schematic cross-sectional view showing an example of an aluminum-diamond composite that is obtained by the above-described production method. In FIG. 1, the opening in a porous material 50 is a through hole that penetrates in the vertical direction. However, the opening may be, for example, a recessed part having an opening on one main surface side of the porous material 50. In addition, from the viewpoint of obtaining a more uniform composite as a target aluminum-diamond composite 100, it is desirable to provide one opening at the center of the porous material 50, but the number and position of openings are not particularly limited, for example, a plurality of openings may be provided in one porous material 50, and the position where the opening is to be formed may also be adjusted as appropriate. In the following description, the opening will be described based on an example where the opening is a through hole; however, in a case where the opening is a recessed part, it is permitted to understand that one of the metal plates 60 in FIG. 1(a) may form a single body with the porous material 50 using the same material.

The laminate structure-laying step is a step of providing a laminate structure 30 in the opening of the porous material 50, which is installed between the two metal plates 60 and is a frame material that becomes a mold for the aluminum-diamond composite 100, so as to be apart from an inner circumferential surface 50a of the opening of the porous material 50 by providing a gap therebetween. A method for providing the laminate structure 30 in the opening of the porous material 50 is not particularly limited and may be a method in which the porous material 50 is installed on the metal plate 60 and then each layer configuring the laminate structure 30 is sequentially laminated or a method in which the separately-formed laminate structure 30 is inserted into the opening of the porous material 50. Means for providing the gap (distance g) between the inner circumferential surface 50a of the opening of the porous material 50 and the outer circumferential surface of the laminate structure 30 may be, for example, a method in which a spacer having a predetermined thickness that is small enough for the spacer to be removed afterwards is provided so as to be in contact with the inner circumferential surface 50a of the opening, the laminate structure 30 is formed on or inserted into the inside of the spacer (a space on the opposite side to the porous material 50) and then the spacer is removed. FIG. 1 shows the example where one laminate structure 30 is provided, but a plurality of laminate structures 30 may be laminated along the thickness direction of the porous material 50 in the opening of the porous material 50.

The distance g between the inner circumferential surface 50a of the opening of the porous material 50 and the outer circumferential surface of the laminate structure 30 can be adjusted depending on the thickness of the metal layers that are formed on the side surfaces of the target aluminum-diamond composite. The distance g between the inner circumferential surface 50a of the opening of the porous material 50 and the outer circumferential surface of the laminate structure 30 may be, for example, 0.05 to 3.50 mm, 0.05 to 2.50 mm or 0.05 to 1.00 mm.

For the metal plates 60, for example, steel plates, stainless steel plates and the like can be used.

As the porous material 50, a heat-resistant porous material into which a melt of a metal containing aluminum can be press-fitted or infiltrated in the metal layer-forming step to be described below is used. For the porous material 50, a porous sintered body made of graphite or boron nitride (for example, an isotropic graphite mold material or the like), a porous body composed of alumina fibers and the like can be used. The shape of the opening of the porous material 50 can be adjusted depending on the shape of the target aluminum-diamond composite 100. In the production method of the present disclosure, since the shape of the aluminum-diamond composite 100 can be changed by adjusting the shape of the opening of the porous material 50, unlike molding by laser processing or the like in conventional methods, the degree of freedom in design is excellent.

The laminate structure 30 that is provided in the laminate structure-laying step includes a first mold release plate 6a, a first inorganic layer 4a, a composition layer 2, a second inorganic layer 4b and a second mold release plate 6b in this order. The first inorganic layer 4a and the second inorganic layer 4b may be the same as or different from each other.

The composition layer 2 may be composed of, for example, a diamond powder alone or may further contain a different component. The different component may be, for example, a binder such as silica. In a case where the composition layer 2 contains a different component, the content of the different component may be, for example, 0.5 to 3.0 mass % based on the total amount of the composition layer 2.

The diamond powder that configures the composition layer 2 may be a powder of natural diamond, may be a powder of artificial diamond or may be a mixture of both. As the diamond powder, it is also possible to use diamond particles having a ß-type silicon carbide layer on the surface. Such diamond particles are capable of suppressing the generation of a metal carbide having a low thermal conductivity (for example, aluminum carbide ($Al_4C_3$)) when being brought into contact with the melt of the metal containing aluminum in the metal layer-forming step and are, furthermore, capable of further improving the thermal conductivity of the aluminum-diamond composite 100 to be obtained.

The particle size distribution of the diamond powder may be adjusted from the viewpoint of improving the thermal conductivity. The diamond powder preferably has a plurality of peaks in a volume-based particle size distribution curve. Such a diamond powder may be a powder mixture of two or more powders having a different average particle diameter. The diamond powder may have, for example, a first peak in a range where the particle diameters are 5 to 25 μm and a second peak in a range where the particle diameters are 55 to 195 μm in the volume-based particle size distribution curve. The first peak is preferably present in a range where the particle diameters are 10 to 20 μm. The second peak is preferably present in a range where the particle diameters are 100 to 180 μm.

The average particle diameter in the present specification is a particle diameter at which the cumulative value in a cumulative particle size distribution reaches 50% (median diameter, d50). The average particle diameter in the present specification is measured using a laser diffraction and scattering method particle size distribution analyzer according to ISO 13320: 2009. As the laser diffraction and scattering method particle size distribution analyzer, for example, "LS-13 320" (device name) manufactured by Beckman Coulter, Inc. or the like can be used.

The diamond powder desirably contains a relatively large amount of a powder having large particle diameters. In the volume-based particle size distribution curve, when the area in the range where the particle diameters are 1 to 35 μm is indicated by A, and the area in the range where the particle diameters are 45 to 205 μm is indicated by B, the ratio of B to A (B/A value) in the diamond powder may be 1.5 or more, 2.3 or more, 4.0 or more or 9.0 or more. When the B/A value is within the above-described range, the filling amount of diamond can be improved, and the thermal conductivity of the aluminum-diamond composite 100 to be obtained can be improved.

The particle size distribution in the present specification means values that are measured based on the Coulter method.

The first inorganic layer 4a and the second inorganic layer 4b may be each independently, for example, at least one of an inorganic fiber-containing layer and a metal foil containing aluminum.

The inorganic fiber-containing layer is composed of, for example, inorganic fiber mesh so that the melt of the metal containing aluminum can be press-fitted or used for impregnation in the metal layer-forming step to be described below. The inorganic fiber may be, for example, a metal fiber or a ceramic fiber. The ceramic fiber may be, for example, an alumina fiber, a glass fiber or the like. The metal foil containing aluminum may be, for example, an aluminum foil, an aluminum alloy foil or the like.

The thicknesses of the first inorganic layer 4a and the second inorganic layer 4b may be each independently, for example, 0.01 mm or more, 0.02 mm or more or 0.03 mm or more. When the lower limit values of the thicknesses of the first inorganic layer 4a and the second inorganic layer 4b are within the above-described range, it is possible to more sufficiently suppress the diamond powder being exposed on the surface of the aluminum-diamond composite 100 or the like. The thicknesses of the first inorganic layer 4a and the second inorganic layer 4b may be each independently, for example, 0.20 mm or less, 0.15 mm or less, 0.10 mm or less, 0.08 mm or less or 0.06 mm or less. When the upper limit values of the thicknesses of the first inorganic layer 4a and the second inorganic layer 4b are within the above-described range, it is possible to more sufficiently suppress a decrease in the thermal conductivity of the aluminum-diamond composite 100 to be obtained in the thickness direction. The thicknesses can be adjusted within the above-described ranges and may be, for example, 0.01 to 0.20 mm or 0.02 to 0.15 mm.

The thicknesses of the first inorganic layer 4a and the second inorganic layer 4b in the present specification can be measured with a micrometer and are arithmetic average values of values measured at five points in the surface. The thicknesses of the first inorganic layer 4a and the second inorganic layer 4b are desirably the same thicknesses from the viewpoint of improving the thermal conductivity or the like of the aluminum-diamond composite 100 to be obtained and suppressing the warpage of the aluminum-diamond composite 100 caused by a difference in the thermal expansion coefficient.

As the first mold release plate 6a and the second mold release plate 6b, it is possible to use plates having a dense structure so that a sufficient pressure can be applied when the melt of the metal containing aluminum is press-fitted and used to impregnate the composition layer 2 in the metal layer-forming step to be described below. As the first mold release plate 6a and the second mold release plate 6b, for example, stainless steel plates, ceramic plates and the like can be used. A mold release agent may be applied or a mold release treatment may be performed on the main surfaces of the first mold release plate 6a and the second mold release plate 6b on the composition layer 2 side. Examples of such a mold release agent include graphite, boron nitride, alumina and the like. As the first mold release plate 6a and the second mold release plate 6b, it is possible to use, for example, a mold release plate obtained by forming a coating layer using an alumina sol or the like on the main surface on the composition layer 2 side and then further attaching a mold release agent thereto. The use of such a mold release plate makes it possible to perform more stable mold release and makes it possible to make the main surface of the aluminum-diamond composite 100 to be obtained smoother.

In the metal layer-forming step, the melt of the metal containing aluminum is supplied to the space between the porous material 50 and the laminate structure 30 through the porous material 50, whereby a composited part containing aluminum and diamond is formed, and metal layers are formed on at least the side surfaces of the laminate structure 30. In the metal layer-forming step, metal-containing layers 22a and 22b may be formed by infiltrating the melt of the metal containing aluminum into not only metal layers 24 but also the insides of the first inorganic layer 4a and the second inorganic layer 4b or the main surfaces of the first inorganic layer 4a and the second inorganic layer 4b on the composition layer 2 side. In a case where the first inorganic layer 4a and the second inorganic layer 4b are composed of inorganic fiber mesh, in the step, the mesh is impregnated with the melt of the metal containing aluminum, the metal-containing layers are formed, and the composited part and the metal-containing layers strongly join together. In addition, in a case where the first inorganic layer 4a and the second inorganic layer 4b are composed of metal foils containing aluminum, the metal foils themselves configure the metal-containing layers, and the melt of the metal containing aluminum infiltrates onto the main surfaces of the first inorganic layer 4a and the second inorganic layer 4b on the composition layer 2 side, whereby the composited part and the metal-containing layers strongly join together.

In the metal layer-forming step, a method for supplying the melt of the metal containing aluminum may be, for example, a so-called high-pressure forging method in which an object is impregnated with the melt of the metal at a high pressure. From the viewpoint of obtaining the aluminum-diamond composite 100 having a superior thermal conductivity, it is desirable to use a cast forging process in the metal layer-forming step. The metal layer-forming step is performed by, for example, immersing a laminate itself prepared in the laminate structure-laying step in a container filled with the melt and applying a pressure to the melt. This makes the melt infiltrate through pores in the porous material 50 and be supplied to the space between the inner circumferential surface 50a of the opening of the porous material 50 and the outer circumferential surface of the laminate structure and then makes up to the inside of the composition layer 2 impregnated with the melt, thereby causing compositing.

The melt of the metal containing aluminum may contain, for example, in addition to aluminum, a different metal. Examples of the different metal include silicon, magnesium, copper and the like. At least any of silicon and magnesium is preferably contained as the different metal. When the melt contains the above-described metals, since the melting point of the melt can be lowered and the melt viscosity can be decreased during the impregnation, it is possible to make the melt sufficiently infiltrate even into voids that are configured among the particles of the diamond powder in the composition layer 2. Such an action makes it possible to further improve the density of the composited part in the aluminum-diamond composite 100 to be obtained. In a case where the melt contains silicon, it is possible to further lower the melting point, and, in a case where the melt contains magnesium, it is possible to make the bond between the composited part and the metal layers stronger. In a case where the metal contains, in addition to aluminum, the different metal, the content of the different metal may be 2 to 20 mass %, 2 to 15 mass % or 5 to 15 mass % based on the total amount of the melt.

When the composition layer 2 is impregnated with the melt, the laminate structure 30, the porous material 50 and the metal plates 60 are desirably in a heated state. The lower limit value of the heating temperature may be, for example, 520° C. or higher or 540° C. or higher. When the lower limit value of the heating temperature is set within the above-described range, it is possible to more easily impregnate the composition layer 2 with the melt and to more stably perform compositing in the metal layer-forming step. The upper limit value of the heating temperature may be, for example, 750° C. or lower or 700° C. or lower. When the upper limit value of the heating temperature is set within the above-described range, it is possible to further suppress the formation of aluminum carbide ($Al_4C_3$) at the time of compositing with aluminum and to further improve the thermal conductivity of the aluminum-diamond composite 100. The heating temperature may be adjusted within the above-described range and can be set to, for example, 520° C. to 750° C. or 540° C. to 700° C.

The pressure at the time of impregnating the composition layer 2 with the melt may be, for example, 20 MPa or higher, 30 MPa or higher, 40 MPa or higher or 50 MPa or higher. When the lower limit value of the pressure at the time of impregnating the composition layer 2 with the melt is set within the above-described range, it is possible to more stably perform compositing in the metal layer-forming step and to further improve the thermal conductivity of the aluminum-diamond composite 100 to be obtained. The pressure at the time of impregnating the composition layer 2 with the melt may be, for example, 150 MPa or lower, 100 MPa or lower or 80 MPa or lower. The pressure at the time of impregnating the composition layer 2 with the melt may be adjusted within the above-described range and may be, for example, 20 to 150 MPa.

In the layer thickness-adjusting step, the average thickness of the metal layers 24 is adjusted to 0.01 to 3.00 mm. The step makes it possible to adjust the average thickness, surface roughness Ra, dimensions, dimensional accuracy and the like of the metal layers. In the step, the average thicknesses of the metal-containing layers 22a and 22b can also be adjusted as necessary.

Prior to the layer thickness-adjusting step, the metal plates 60 and the porous material 50 are removed, and the first mold release plate 6a and the second mold release plate 6b are peeled off from the metal-containing layer 22a and the metal-containing layer 22b, respectively. As means for adjusting the average thickness of the metal layers 24, a processing method that is adopted in normal metal processing can be adopted, and the average thickness can be adjusted by, for example, polishing, surface grinding or the like.

The above-described production method may have, in addition to the laminate structure-laying step, the metal layer-forming step and the layer thickness-adjusting step, a different step. Examples of the different step include an annealing step, a surface treatment step and the like.

The annealing step is a step of reducing distortion or the like that can be present in a composited part 10, the metal layers 24 or the like by performing a heating treatment at a relatively low temperature before the layer thickness-adjusting step and after the formation of the metal layers 24. The step makes it possible to produce the aluminum-diamond composite 100 having a superior thermal conductivity. The heating temperature in the annealing step may be, for example, 400° C. to 550° C. or 400° C. to 500° C. The heating time in the annealing step may be, for example, 10 minutes or longer or 20 minutes or longer and may be 24 hours or shorter or 12 hours or shorter.

In the production method according to the present disclosure, the content of aluminum in the melt of the metal containing aluminum may be, for example, 80 mass % or more. In addition, in the production method according to the present disclosure, the content of aluminum in any of the metal-containing layer 22a, the metal-containing layer 22b and the metal layer 24 may be, for example, 80 mass % or more. In this case, it is possible to more easily perform processing by a normal metal processing method such as polishing. The above-described content of aluminum may be 85 mass % or more, 90 mass % or more or 95 mass % or more, and the contents of aluminum in the metal-containing layer 22a and the metal-containing layer 22b may be 100 mass % (that is, metal foils made of aluminum).

Figure 2:
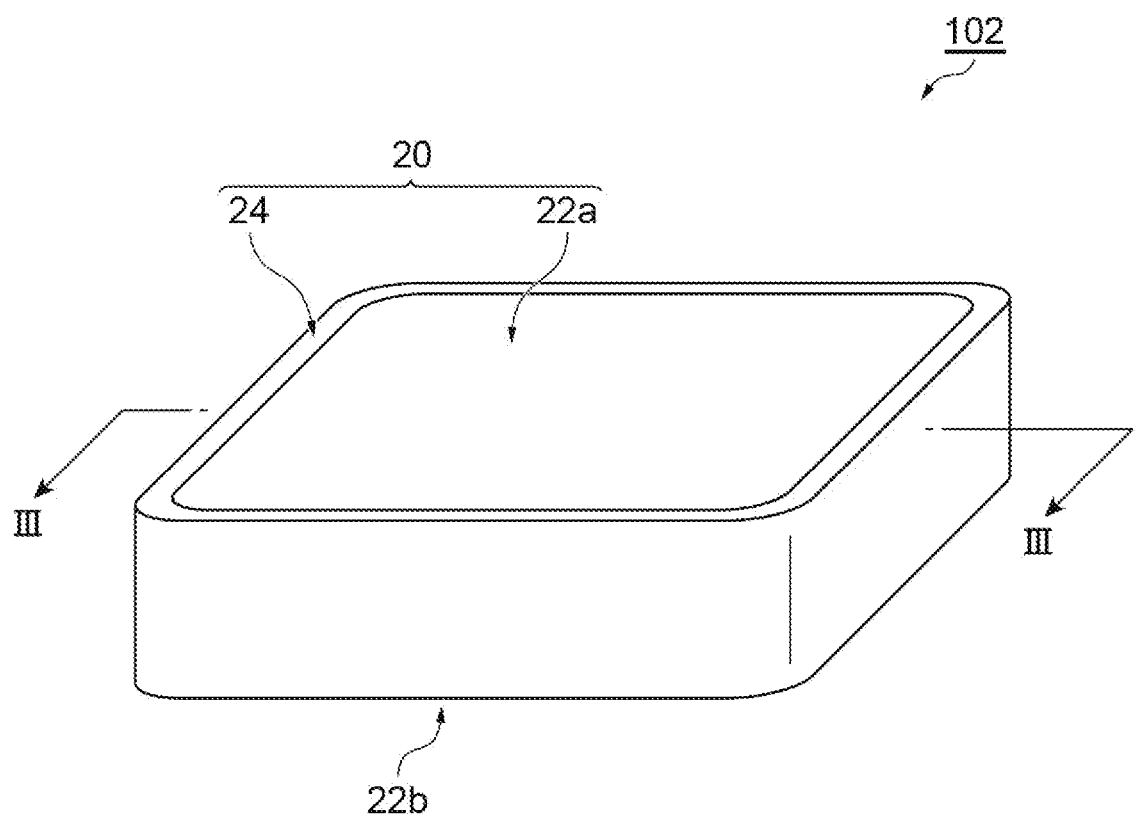
FIG. 2 is a perspective view showing an example of an aluminum-diamond composite.
Figure 3:
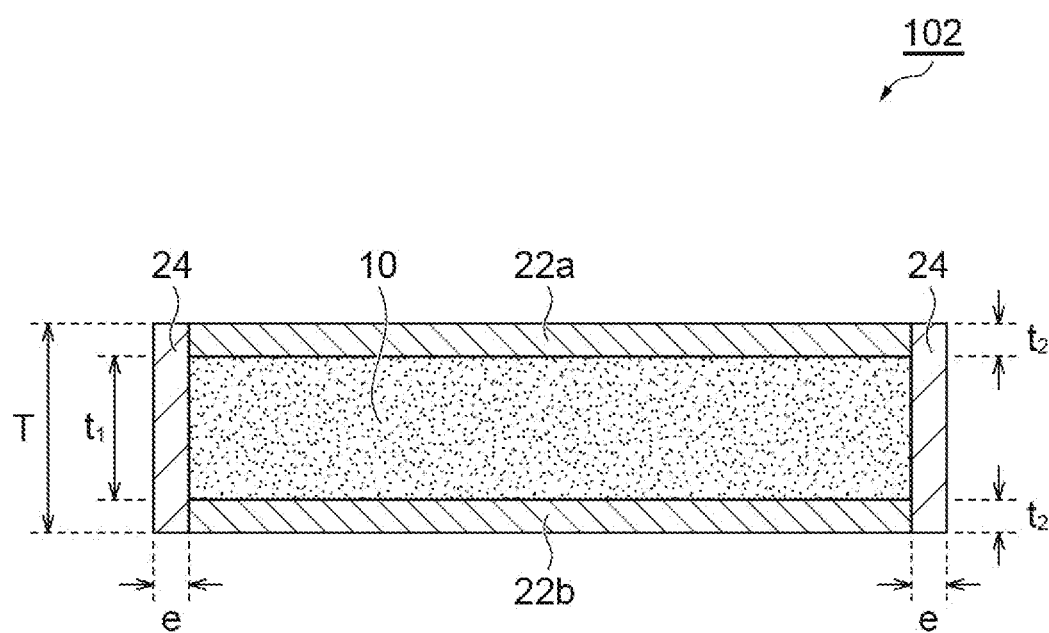
FIG. 3 is a cross-sectional view along a line III-III in FIG. 2.

FIG. 2 is a perspective view showing an example of an aluminum-diamond composite that is obtained by the above-described production method. FIG. 3 is a cross-sectional view along the line III-III in FIG. 2. An aluminum-diamond composite 102 has a flat plate-like composited part 10 containing aluminum and diamond and a coating layer 20 provided on the surface of the composited part 10. The coating layer 20 has metal-containing layers 22a and 22b provided on a pair of main surfaces of the composited part 10 and metal layers 24 that are provided on the side surfaces of the composited part 10. The aluminum-diamond composite 102 may be the same as the aluminum-diamond composite 100 that is obtained by the description of the above-described production method.

A thickness $t_1$ of the composited part 10 may be, for example, 0.4 to 6.0 mm, 0.4 to 5.0 mm or 0.4 to 4.0 mm. When the lower limit value of the thickness t is within the above-described range, it is possible to ensure a sufficient strength even at the time of using the aluminum-diamond composite 102 as, for example, a heat sink or the like. When the upper limit value of the thickness $t_1$ is within the above-described range, it is possible to ensure a sufficient thermal conductivity as the aluminum-diamond composite 102 and to suppress an increase in the production cost.

The total value ($2t_2$) of the thicknesses of the metal-containing layers 22a and 22b that configure both main surfaces of the aluminum-diamond composite 102 may be, for example, 20% or less, 15% or less or 10% or less based on a thickness T of the aluminum-diamond composite 102. When the total value ($2t_2$) of the thicknesses of the metal-containing layers 22a and 22b is within the above-described range, it is possible to improve the plating properties while ensuring the thermal conductivity.

The average thickness $t_2$ of the thicknesses of the metal-containing layers 22a and 22b provided on both main surfaces of the composited part 10 may be, for example, 0.01 to 0.20 mm or 0.02 to 0.15 mm. The average thickness $t_2$ of the thicknesses of the metal-containing layers 22a and 22b provided on both main surfaces of the composited part 10 can be adjusted by adjusting the thicknesses of a first inorganic layer 4a and a second inorganic layer 4b.

The average thickness e of the metal layers 24 on the side surfaces of the composited part 10 is, for example, 0.01 to 3.00 mm. The average thickness e of the metal layers 24 on the side surfaces of the composited part 10 can be adjusted with the distance between an inner circumferential surface 50a of the opening of a porous material 50 and the outer circumferential surface of a laminate structure 30, the layer thickness-adjusting step or the like in the above-described method for producing an aluminum-diamond composite.

Figure 4:
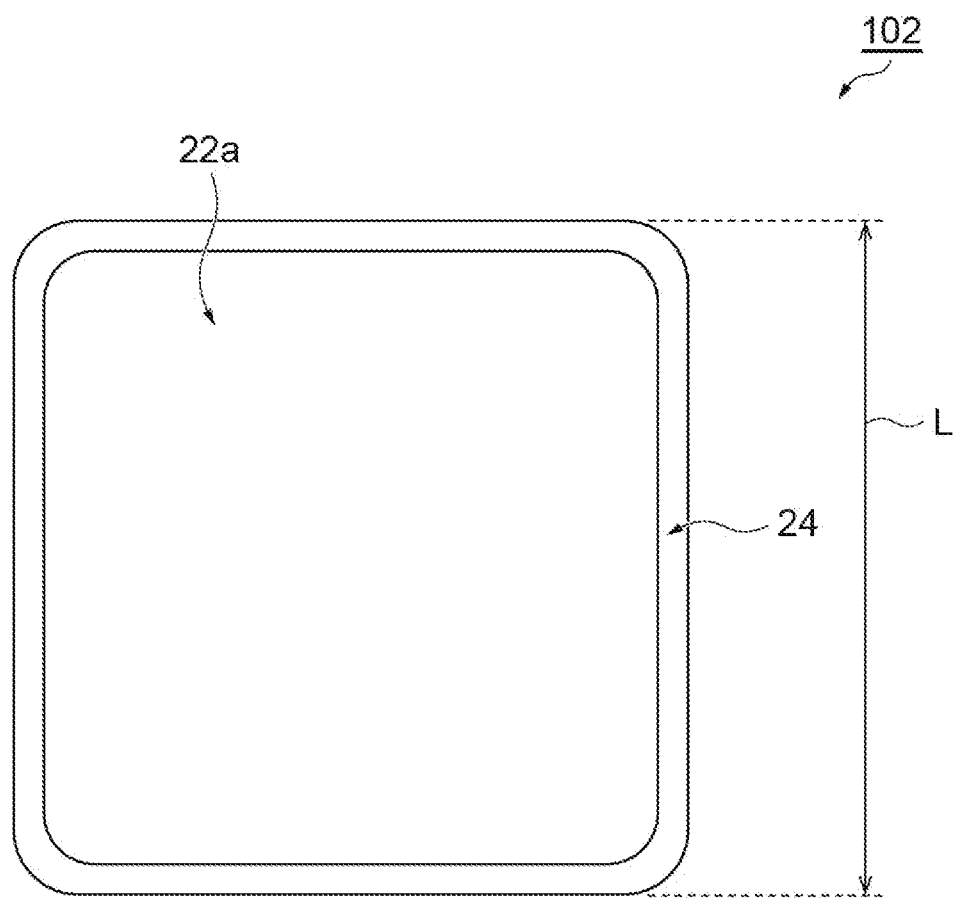
FIG. 4 is a top view showing an example of the aluminum-diamond composite.

FIG. 4 is a top view showing an example of the aluminum-diamond composite 102. The average thickness e of the metal layer 24 formed on the side surface of the aluminum-diamond composite 102 can be adjusted to a certain degree of thickness from the viewpoint of further suppressing the generation of cracks or the like in a case where the metal layer receives a thermal shock due to a heat cycle test or the like. The total value (2e) of the average thicknesses e of the metal layers 24 formed on both side surfaces of the aluminum-diamond composite 102 may be, for example, 30% or less, 20% or less, 15% or less or 10% or less based on an external dimension L of the aluminum-diamond composite 102. The external dimension means the maximum value of the lengths of the sides of the aluminum-diamond composite 102.

On the top view of the aluminum-diamond composite 102, when the area of the metal layers 24 is indicated by C, and the area of the metal-containing layer 22a is indicated by D, C may be, for example, 50.0% or less, 40.0% or less or 30.0% or less based on D. C may be, for example, 0.1% or more or 0.5% or more based on D. The area C of the metal layers 24 on the top view of the aluminum-diamond composite 102 (the area of a band-like region including the outer edge on the top view of the aluminum-diamond composite 102) may be adjusted within the above-described range and may be, for example, 0.1 to 50.0% based on the area D of the metal-containing layer 22a on the top view of the aluminum-diamond composite 102.

On the top view of the aluminum-diamond composite 102, the curvature radii at the four corners of the metal layer 24 may be, for example, 0.5 mm or more, 0.7 mm or more or 1.0 mm or more. When the curvature radii are within the above-described range, the handleability of the aluminum-diamond composite 102 can be improved, and it is also possible to suppress other members being damaged during transportation or the like. The curvature radii at the four corners of the metal layer 24 may be, for example, 5.0 mm or less or 4.0 mm or less.

The surfaces of at least one of the metal-containing layers 22a and 22b and the metal layers 24 on the opposite side to the composited part 10 side may be smooth surfaces. The surfaces of the metal-containing layers 22a and 22b on the opposite side to the composited part 10 side may be smooth surfaces. The surfaces of the metal layers 24 on the opposite side to the composited part 10 side may be smooth surfaces. The surface roughness Ra on the above-described smooth surfaces may be, for example, 0.5 to 1.0 μm or 0.5 to 0.8 μm. When the surface roughness Ra is within the above-described range, it is possible to further reduce thermal resistance in joint surfaces with other members at the time of using the aluminum-diamond composite 100 or 102 as, for example, a heat dissipation member such as a heat sink.

The surface roughness Ra in the present specification means the arithmetic average roughness described in JIS B 0601: 1994 "Geometrical Product Specifications (GPS)-Surface texture: Profile method-Terms, definitions and surface texture parameters" and can be measured with a line contact-type measuring instrument. As the line contact-type measurement, for example, "surface roughness measuring instrument SURFTEST SJ-301" (product name) manufactured by Mitutoyo Corporation or the like can be used.

The flatness of the metal-containing layers 22a and 22b in the aluminum-diamond composites 100 and 102 may be, for example, 0.020 mm or less or 0.010 mm or less when converted to a 10 mm×10 mm size. When the flatness is within the above-described range, it is possible to suppress a variation in joint layers with other members and to obtain higher heat dissipation properties.

The lower limit value of the content of aluminum in the metal layers 24 configuring the aluminum-diamond composite 100 or 102 may be, for example, 80 mass % or more, 82 mass % or more, 84 mass % or more or 86 mass % or more. The upper limit value of the content of aluminum in the metal layers 24 configuring the aluminum-diamond composite 100 or 102 may be, for example, 98 mass % or less, 96 mass % or less, 94 mass % or less, 92 mass % or less, 90 mass % or less or 88 mass % or less.

The lower limit value of the content of aluminum in the metal-containing layers 22a and 22b configuring the aluminum-diamond composite 100 or 102 may be, for example, 90 mass % or more, 92 mass % or more, 94 mass % or more, 96 mass % or more or 98 mass % or more. The upper limit value of the content of aluminum in the metal-containing layers 22a and 22b configuring the aluminum-diamond composite 100 or 102 is not particularly limited and may be 100 mass % (that is, layers made of aluminum), but may be, for example, 99 mass % or less.

The contents of aluminum in the metal-containing layers on both main surfaces and the metal layers on the side surfaces of the aluminum-diamond composite in the present specification mean values that are measured with an energy-dispersive X-ray spectrometer.

The aluminum-diamond composites 100 and 102 have excellent thermal conduction properties. The thermal conductivities of the aluminum-diamond composites 100 and 102 at 25° C. can be set to, for example, 400 W/mK or higher, 450 W/mK or higher or 500 W/mK or higher.

The thermal conductivity in the present specification means a value that is measured by a laser flash method. In the measurement for example, "LF/TCM-8510B" (product name) manufactured by Rigaku Corporation or the like can be used.

Deformation of the aluminum-diamond composites 100 and 102 during heating is suppressed to a small extent. The linear expansion coefficients of the aluminum-diamond composites 100 and 102 in the case of being heated from 25° C. to 400° C. can be set to, for example, $5.0 \times 10^{-6}$ to $10.0 \times 10^{-6}$ $K^{-1}$, $5.5 \times 10^{-6}$ to $9.0 \times 10^{-6}$ $K^{-1}$ or $5.5 \times 10^{-6}$ to $8.5 \times 10^{-6}$ $K^{-1}$.

The linear expansion coefficient in the present specification means a value that is measured using a thermal dilatometer. In the measurement, for example, "TMA300" (product name) manufactured by Hitachi High-Tech Corporation or the like can be used.

The above-described aluminum-diamond composites 100 and 102 have an excellent thermal conductivity and thus can be suitably used as heat dissipation members or the like. The aluminum-diamond composite according to the present disclosure has the same level of thermal conductivity as ordinary semiconductor elements and is also useful as heat dissipation members for semiconductor elements. Here, examples of the semiconductor elements include semiconductor laser elements for which a high output is required, such as gallium nitride (GaN), gallium arsenide (GaAs) and silicon carbide (SiC), high-frequency elements such as GaN-HEMT (High Electron Mobility Transistor) elements and GaAs-HEMT elements, and the like.

The above-described aluminum-diamond composites 100 and 102 can also be used as, for example, a plated member having a plating layer formed thereon. An embodiment of the plated member has a flat plate-like aluminum-diamond composite and a metal plating layer provided on the aluminum-diamond composite, and the aluminum-diamond composite is the above-described aluminum-diamond composite.

The metal plating layer in the plated member may have a nickel plating layer and a gold plating layer in this order from the aluminum-diamond composite side. In this case, it is preferable that the average thickness of the nickel plating layer is 0.5 to 6.5 µm, and the average thickness of the gold plating layer is 0.5 µm or more. When the average thickness of the nickel plating layer is within the above-described range, the generation of a defect such as a pinhole in the plating layer is suppressed, and it is possible to more sufficiently suppress the peeling of plating films and the generation of cracks or the like under high-temperature environments at the time of using the plated member.

For the formation of the plating layers, an ordinary plating method can be used. As the plating method, for example, an electrolytic plating method, an electroless plating method or the like can be used. In a case where nickel plating is performed on the metal-containing layers 22a and 22b and the metal layers 24, for example, a pretreatment for substituting at least a part of the surfaces of the aluminum-diamond composite 100 or 102 with zinc or the like may also be performed. Such a pretreatment makes it possible to further improve the adhesion of the plating layers.

In a case where nickel plating has been performed, it is more preferable to further provide an amorphous nickel alloy plating having a thickness of 0.5 to 6.5 µm. In this case, since the generation of a pinhole or the like can be suppressed even when the diamond powder is exposed on the surface of the aluminum-diamond composite, means for forming the amorphous nickel alloy plating is preferably the electroless plating method. In this case, the amorphous nickel alloy plating may be an alloy plating containing, for example, 5 to 15 wt % of nickel and phosphorus (P).

In addition, in association with an increase in the joining temperature or an increase in the temperature load during actual uses, there may be cases where the amorphous nickel alloy plating crystallizes, a volume change at this time generates microcracks and cracks propagate due to a subsequent temperature load. Therefore, a nickel alloy plating layer preferably has a thickness of, for example, 0.5 µm to 2 µm.

In a case where the plated member is used in a use where joining is performed at a high temperature using a brazing filler metal, it is desirable to provide a gold plating layer on the outermost surface of the plated member. The thickness of the gold plating layer may be, for example, 0.01 µm or more from the viewpoint of making the joint sufficiently strong. The thickness of the metal plating layer may be, for example, 4.00 µm or less from the viewpoint of suppressing the cost.

Hitherto, several embodiments have been described, and it is possible to apply mutual descriptions to common configurations. In addition, the present disclosure is not limited to the above-described embodiment by any means.

EXAMPLES

The contents of the present disclosure will be described in more detail with reference to examples and comparative examples, but the present disclosure is not limited to the following examples.

Example 1

A high-purity diamond powder having an average particle diameter of 130 µm (manufactured by Diamond Innovation Co., Ltd.) and a high-purity diamond powder having an average particle diameter of 15 µm (manufactured by Diamond Innovation Co., Ltd.) were mixed together in a mass ratio of 7:3 to prepare a powder mixture. In addition, the surfaces of stainless steel plates (SUS430 material) that were 43.4 mm in length, 43.4 mm in width and 2 mm in thickness were coated with an alumina sol and baked at 350° C. for 30 minutes. After that, a graphite-based mold release agent was applied to the surfaces to fabricate mold release plates.

Next, an isotropic graphite mold material (porosity: 20 vol %) having an external form that was 80 mm in length, 80 mm in width and 5.5 mm in thickness and having an opening (length: 50.2 mm, width: 50.2 mm, radius curvatures at four corners: 1.0 mm) penetrating in the thickness direction at the central part was prepared on an iron plate having a thickness of 12 mm, and a spacer having a thickness of 3.40 mm was disposed so as to be in contact with the inner circumferential surface of the opening. The mold release plate and a pure-aluminum foil (aluminum content: 100 mass %, thickness: 0.05 mm, corresponding to a first inorganic layer (future metal-containing layer)) were laminated in this order in a space surrounded by the spacer, and a space thereon was filled with the above-described powder mixture to form a composition layer having a thickness of 2.00 mm. A pure-aluminum foil (aluminum content: 100 mass %, thickness: 0.05 mm, corresponding to a second inorganic layer (future metal-containing layer)) and the mold release plate were further laminated in this order on the composition layer to provide a laminate structure. After that, the spacer was removed to form a space between the isotropic graphite mold material and the laminate structure. After the spacer was removed, a block-like structure having another iron plate overlapped on the laminate structure was obtained (the same structure as shown in FIG. 1(a) was formed; laminate structure-laying step).

The block-like structure was preliminarily heated at 650° C. in an electric furnace and then stored in a press mold having an inner diameter of 300 mm that had been heated in advance and placed. A mixture of metals having a composition of 12 mass % of silicon, 1 mass % of magnesium and 87 mass % of aluminum was melted at 800° C. to make a melt (molten metal), this was poured into the press mold in which the preliminarily heated block-like structure was stored, and a pressure of 100 MPa was applied thereto for 20 minutes, whereby the melt was infiltrated into the inside (metal layer-forming step). After that, the block-like structure was cooled to room temperature. The content of aluminum in the melt of the metals was determined by the measurement of the mixture of the metals before the melting using optical emission spectroscopy.

After the cooling, the block-like structure was cut with a wet band saw slightly inside along the shape of the isotropic graphite mold material, and the iron plates, the isotropic graphite mold material and the mold release plates were peeled off. After that, an annealing treatment was performed at 450° C. for three hours to remove distortion caused during the impregnation (annealing step). After the annealing treatment, the surface of the annealed product was polished, thereby obtaining an aluminum-diamond composite.

<Physical Property Measurement of Aluminum-Diamond Composite>

Regarding the obtained aluminum-diamond composite, the external dimension, the average thicknesses of the metal-containing layers and the metal layers, the proportion of the metal layers on the side surfaces, the aluminum content of the metal layers and the curvature radius were measured. The results are shown in Table 1.

[Measurement of External Dimension]

The external dimension of the aluminum-diamond composite was measured using a caliper.

[Measurement of Average Thicknesses of Metal-Containing Layers and Metal Layers]

Figure 5:
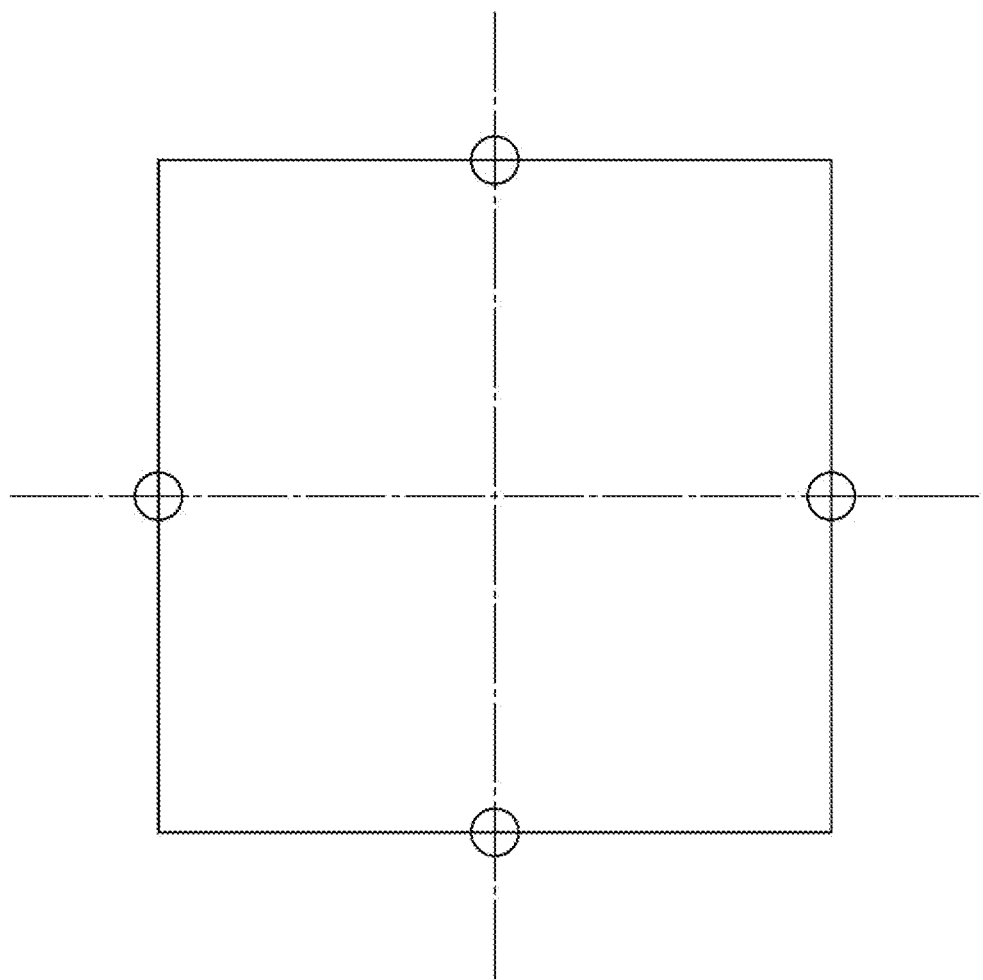
FIG. 5 is a schematic view for describing a measurement method in examples.

The thicknesses of the metal-containing layers on both main surfaces and the metal layers on the side surfaces of the aluminum-diamond composite were measured as described below. As shown in FIG. 5, the aluminum-diamond composite was cut with a diamond processing jig along the center lines (indicated by dashed lines in FIG. 5) of the aluminum-diamond composite. After that, images of portions of cut surfaces including both main surfaces and a side surface were acquired with a scanning electron microscope at a magnification of 100 times at the edges of four places indicated by reference signs O in FIG. 5. The distances from the outermost surface and the side surface to the diamond powder were measured at five points at 200 μm intervals. The same measurement was performed at the four places, and the arithmetic average value thereof was regarded as the average thickness of the metal layers.

[Proportion of Metal Layers on Top View]

The proportion of the metal layers on the top view was calculated from the values of the external dimension and the average thickness of the metal layers acquired by the above-described measurement using the following formula.

Proportion of metal layers on top view=100−[(external dimension)−2(average thickness of metal layers)]$^2$÷[external dimension]$^2$×100

[Measurement of Aluminum Contents of Metal-Containing Layers and Metal Layers]

The aluminum contents of the metal-containing layers on both main surfaces and the metal layers on the side surfaces of the aluminum-diamond composite were measured with an energy-dispersive X-ray spectrometer.

[Measurement of Curvature Radius]

The curvature radii at the four corners of the aluminum-diamond composite were measured with a computer numerical control (CNC) image measuring instrument.

<Evaluation of Aluminum-Diamond Composite>

Regarding the aluminum-diamond composite, the presence or absence of a chip in the outer circumference and the thermal shock resistance were evaluated according to methods to be described below. The results are shown in Table 1.

[Presence or Absence of Chip in Outer Circumference]

Regarding the aluminum-diamond composite, the side surfaces were observed with a stereo microscope at a magnification of 10 times immediately after the steel plates, the isotropic graphite mold material and the mold release plates were peeled off, and the results were evaluated with the following standards.

A: No chips having a diameter of 100 μm or more are generated in the metal layers containing aluminum as a main component in the entire region of the outer circumferential part including four corners.

B: One or more chips having a diameter of 100 μm or more are generated in the metal layers containing aluminum as a main component in the entire region of the outer circumferential part including four corners.

[Thermal Shock Resistance]

A heat cycle test was performed on the aluminum-diamond composite under the following conditions. Specifically, a cycle of exposing the aluminum-diamond composite to a gas phase held at −40° C. for 30 minutes and then exposing the aluminum-diamond composite to a gas phase held at 125° C. for 30 minutes was repeated 100 times. After that, the composite surface was observed with a stereo microscope at a magnification of 10 times and ultrasonic test equipment, and the obtained result was evaluated with the following standards.

A: No cracks were confirmed in the interfaces between the composited part and the metal layer in both of microscopic observation and ultrasonic testing.

B: Cracks were confirmed in the interfaces between the composited part and the metal layer in any of microscopic observation and ultrasonic testing.

Examples 2 to 8

Aluminum-diamond composites were fabricated in the same manner as in Example 1 except that the separation distance between the inner circumferential surface of the opening and the outer circumferential surface of the laminate structure was changed as shown in Table 1.

Examples 9 to 11

Aluminum-diamond composites were fabricated in the same manner as in Example 1 except that the size of the opening of the porous material was changed and the separation distance between the inner circumferential surface of the opening and the outer circumferential surface of the laminate structure was changed as shown in Table 1.

Examples 12 and 13

Aluminum-diamond composites were fabricated in the same manner as in Example 1 except that the separation distance between the inner circumferential surface of the opening and the outer circumferential surface of the laminate structure was changed as shown in Table 1 and aluminum alloy foils were used as a first metal foil and a second metal foil.

Examples 14 and 15

Aluminum-diamond composites were fabricated in the same manner as in Example 1 except that the separation distance between the inner circumferential surface of the opening and the outer circumferential surface of the laminate structure was changed as shown in Table 1 and the content of aluminum in the molten metal was changed.

Example 16

An aluminum-diamond composite was fabricated in the same manner as in Example 1 except the following change;

the mold release plate and alumina fibers (thickness: 0.05 mm, porosity: 90%, corresponding to the first inorganic layer) were laminated in this order in the space surrounded by the spacer and, furthermore, alumina fibers (thickness: 0.05 mm, porosity: 90%, corresponding to the second inorganic layer) and the mold release plate were laminated in this order on a composition layer formed on the above-described mold release plate and alumina fibers to provide a laminate structure.

Example 17

An aluminum-diamond composite of Example 17 was fabricated by performing the surface grinding of the metal layers on the aluminum-diamond composite obtained in Example 1.

Example 18

An aluminum-diamond composite was fabricated in the same manner as in Example 1 except that the thickness of the pure aluminum foil that was laminated in the space surrounded by the spacer was changed to 0.01 mm.

Example 19

An aluminum-diamond composite was fabricated in the same manner as in Example 1 except that the thickness of the pure aluminum foil that was laminated in the space surrounded by the spacer was changed to 0.2 mm.

Comparative Example 1

An aluminum-diamond composite was fabricated in the same manner as in Example 1 except that the separation distance between the inner circumferential surface of the opening and the outer circumferential surface of the laminate structure was changed as shown in Table 1. As a result, an aluminum-diamond composite having no metal layers on the side surfaces was obtained.

Comparative Example 2

An aluminum-diamond composite was fabricated in the same manner as in Example 1 except that the separation distance between the inner circumferential surface of the opening and the outer circumferential surface of the laminate structure was changed to 4.0 mm.

Comparative Example 3

An aluminum-diamond composite was fabricated in the same manner as in Example 1 except that the size of the opening of the porous material was changed and the separation distance between the inner circumferential surface of the opening and the outer circumferential surface of the laminate structure was changed as shown in Table 1.

<Physical Property Measurement of Aluminum-Diamond Composite>

Regarding each of the aluminum-diamond composites fabricated in Examples 2 to 19 and Comparative Examples 1 to 3, the external dimension, the average thicknesses of the metal-containing layers and the metal layers, the proportion of the metal layers on the side surfaces, the aluminum content of the metal layers and the curvature radius were measured in the same manner as in Example 1. The results are shown in Table 1 and Table 2. In Comparative Example 2, the powder leaked from the composition layer in the middle of the production, and it was not possible to produce a favorable aluminum-diamond composite. Therefore, Comparative Example 2 was excluded from evaluation.

<Evaluation of Aluminum-Diamond Composite>

Regarding each of the aluminum-diamond composites prepared in Examples 2 to 15 and Comparative Examples 1 to 3, the presence or absence of a chip in the outer circumference and the thermal shock resistance were evaluated in the same manner as in Example 1. The results are shown in Table 1. The aluminum-diamond composite fabricated in Comparative Example 1 had no metal layers on the side surfaces, and it was thus not possible to perform the determination of a thermal shock test. Therefore, Comparative Example 1 was excluded from evaluation. In addition, in Comparative Example 2, the powder leaked from the composition layer in the middle of the production, and it was not possible to produce a favorable aluminum-diamond composite. Therefore, Comparative Example 2 was excluded from evaluation.

TABLE 1

| | Production conditions | Aluminum-diamond composite | | | |
|---|---|---|---|---|---|
| | Separation distance between inner circumferential surface of opening and outer circumferential surface of laminate structure [mm] | Aluminum content in melt of metal [mass %] | External dimension L [mm] | Average thickness [mm] | | Proportion of metal layers on side surfaces on top view [area %] |
| | | | | Metal layer | Metal-containing layer | |
| Example 1 | 3.40 | 87 | 49.40 | 3.00 | 0.05 | 22.8 |
| Example 2 | 0.40 | 87 | 49.42 | 0.01 | 0.05 | 0.10 |
| Example 3 | 2.90 | 87 | 49.40 | 2.50 | 0.05 | 19.2 |
| Example 4 | 2.30 | 87 | 49.60 | 2.00 | 0.05 | 15.5 |
| Example 5 | 1.90 | 87 | 49.40 | 1.50 | 0.05 | 11.8 |
| Example 6 | 1.40 | 87 | 49.40 | 1.00 | 0.05 | 7.90 |
| Example 7 | 0.90 | 87 | 49.40 | 0.50 | 0.05 | 4.00 |
| Example 8 | 0.50 | 87 | 49.40 | 0.10 | 0.05 | 0.80 |
| Example 9 | 1.20 | 87 | 9.80 | 1.00 | 0.05 | 36.7 |
| Example 10 | 1.50 | 87 | 10.00 | 1.40 | 0.05 | 48.2 |
| Example 11 | 0.05 | 87 | 10.12 | 0.01 | 0.05 | 0.40 |
| Example 12 | 1.90 | 87 | 49.40 | 1.50 | 0.05 | 11.8 |
| Example 13 | 1.90 | 87 | 49.40 | 1.50 | 0.05 | 11.8 |
| Example 14 | 1.90 | 99 | 49.40 | 1.50 | 0.05 | 11.8 |

TABLE 1-continued

| | | | | | | |
|---|---|---|---|---|---|---|
| Example 15 | 1.90 | 80 | 49.40 | 1.50 | 0.05 | 11.8 |
| Example 16 | 3.40 | 87 | 49.00 | 2.80 | 0.05 | 21.6 |
| Example 17 | 3.40 | 87 | 45.40 | 1.00 | 0.05 | 8.6 |
| Example 18 | 3.40 | 87 | 49.40 | 3.00 | 0.01 | 22.8 |
| Example 19 | 3.40 | 87 | 49.20 | 2.90 | 0.20 | 22.2 |

| | Aluminum-diamond composite | | | | Evaluation | |
|---|---|---|---|---|---|---|
| | Content of aluminum [mass %] | | Curvature radius [mm] | Surface roughness of metal layer Ra [μm] | Presence or absence of chip in outer circumference | Thermal shock resistance (heat cycle test) |
| | Metal layer | Metal-containing layer | | | | |
| Example 1 | 87 | 99 | 1.0 | 0.76 | A | A |
| Example 2 | 87 | 99 | 1.0 | 0.84 | A | A |
| Example 3 | 87 | 99 | 1.0 | 0.60 | A | A |
| Example 4 | 87 | 99 | 1.0 | 0.66 | A | A |
| Example 5 | 87 | 99 | 1.0 | 0.76 | A | A |
| Example 6 | 87 | 99 | 1.0 | 0.92 | A | A |
| Example 7 | 87 | 99 | 1.0 | 0.82 | A | A |
| Example 8 | 87 | 99 | 1.0 | 0.92 | A | A |
| Example 9 | 87 | 99 | 0.5 | 0.95 | A | A |
| Example 10 | 87 | 99 | 0.5 | 0.73 | A | A |
| Example 11 | 87 | 99 | 0.5 | 0.64 | A | A |
| Example 12 | 87 | 80 | 1.0 | 0.90 | A | A |
| Example 13 | 87 | 90 | 1.0 | 0.85 | A | A |
| Example 14 | 99 | 99 | 1.0 | 0.68 | A | A |
| Example 15 | 80 | 99 | 1.0 | 0.74 | A | A |
| Example 16 | 87 | 84 | 1.0 | 0.87 | A | A |
| Example 17 | 87 | 99 | 1.0 | 0.51 | A | A |
| Example 18 | 87 | 99 | 1.0 | 0.87 | A | A |
| Example 19 | 87 | 99 | 1.0 | 0.73 | A | A |

TABLE 2

| | Production conditions | | Aluminum-diamond composite | | | |
|---|---|---|---|---|---|---|
| | Separation distance between inner circumferential surface of opening and outer circumferential surface of laminate structure [mm] | Aluminum content in melt of metal [mass %] | External dimension L [mm] | Average thickness [mm] | | Proportion of metal layers on side surfaces on top view [area %] |
| | | | | Metal layer | Metal-containing layer | |
| Comparative Example 1 | 0.03 | 87 | 50.14 | 0.00 | 0.05 | 0.00 |
| Comparative Example 2 | 4.00 | — | — | — | 0.05 | — |
| Comparative Example 3 | 3.20 | 87 | 10.20 | 3.20 | 0.05 | 86.1 |

| | Aluminum-diamond composite | | | | Evaluation | |
|---|---|---|---|---|---|---|
| | Content of aluminum [mass %] | | Curvature radius [mm] | Surface roughness of metal layer Ra [μm] | Presence or absence of chip in outer circumference | Thermal shock resistance (heat cycle test) |
| | Metal layer | Metal-containing layer | | | | |
| Comparative Example 1 | 87 | 99 | 0.0 | 0.75 | B | — |
| Comparative Example 2 | — | — | 0.8 | — | — | — |
| Comparative Example 3 | 87 | 99 | 0.5 | 0.86 | A | B |

According to the present disclosure, it is possible to provide a method for producing an aluminum-diamond composite more simply than ever without laser processing or the like having to be performed.

Explanation of References

2 Composition layer
4a First inorganic layer
4b Second inorganic layer
6a First mold release plate
6b Second mold release plate
10 Composited part
20 Coating layer
22a, 22b Metal-containing layer
24 Metal layer
30 Laminate structure
50 Porous material
50a Inner circumferential surface of opening
60 Metal plate
100, 102 Aluminum-diamond composite

The invention claimed is:

1. A production method for an aluminum-diamond composite comprising:
   providing a laminate structure, comprised of a first mold release plate, a first inorganic layer, a composition layer containing a diamond powder, a second inorganic layer, and a second mold release plate in this order, in an opening of a flat plate porous material having the opening so that side surfaces of the laminate structure are separated by a gap from an inner circumferential surface of the flat plate porous material; and
   infiltrating a melt of a metal containing aluminum into the porous material and the laminate structure to impregnate the composition layer with the melt, the infiltrating forming in the same infiltrating step each of (a) a composited part containing aluminum and diamond from the composition layer, (b) a metal-containing layer on each of two main surfaces on opposite sides of the composited part, and (c) metal layers on at least side surfaces of the composited part where the gap between the laminate structure and the inner circumferential surface of the porous material had been located,
   wherein the aluminum-diamond composite comprises the composited part containing aluminum and diamond as a flat plate, the metal-containing layers provided on each of the two main surfaces on opposite sides of the composited part, and the metal layers provided on side surfaces of the composited part.

2. The production method according to claim 1, wherein the opening is a through hole that penetrates in a vertical direction.

3. The production method according to claim 1, wherein the opening is a recessed part.

4. The production method according to claim 1, wherein the first inorganic layer is at least one of an inorganic fiber-containing layer and a metal foil containing aluminum.

5. The production method according to claim 1, wherein the second inorganic layer is at least one of an inorganic fiber-containing layer and a metal foil containing aluminum.

6. The production method according to claim 1, wherein the gap comprises a distance between the inner circumferential surface of the porous material and the laminate structure, and is 0.05 to 3.50 mm.

7. The production method according to claim 1, further comprising:
   following the infiltrating, adjusting an average thickness of the metal layers.

8. The production method according to claim 1, wherein the infiltrating of the melt is performed by a cast forging process.

9. The production method according to claim 1, wherein a content of aluminum in the melt is 80 mass % or more.

10. The production method according to claim 1, wherein an average thickness of the metal layers is 0.01 to 3.00 mm.

11. The production method according to claim 10, wherein surfaces of the metal-containing layers and the metal layers opposite to the composited part are smooth surfaces.

12. The production method according to claim 11, wherein surface roughness Ra in the smooth surfaces is 0.5 to 1.0 μm.

13. The production method according to claim 10, wherein an average thickness of the metal-containing layers is 0.01 to 0.20 mm.

* * * * *